United States Patent [19]
Thompson et al.

[11] Patent Number: 5,218,234
[45] Date of Patent: Jun. 8, 1993

[54] SEMICONDUCTOR DEVICE WITH CONTROLLED SPREAD POLYMERIC UNDERFILL

[75] Inventors: Kenneth R. Thompson, Sunrise; Kingshuk Banerj, Plantation; Francisco da Costa Alves, Boca Raton, all of Fla.

[73] Assignee: Motorola, Inc., Schaumburg, Ill.

[21] Appl. No.: 811,841

[22] Filed: Dec. 23, 1991

[51] Int. Cl.$^5$ .................... H01L 23/28; H01L 23/48; H01L 29/46; H01L 23/02
[52] U.S. Cl. ..................... 257/787; 257/738; 257/774; 257/778; 257/792; 361/400; 361/405
[58] Field of Search .................. 361/400, 405; 357/72, 357/80, 71, 74, 75; 257/737, 738, 773, 774, 778, 780, 787, 788, 791, 792

[56] References Cited

U.S. PATENT DOCUMENTS

| | | | |
|---|---|---|---|
| 4,138,691 | 2/1979 | Bonkohara et al. | 357/80 |
| 4,268,848 | 5/1981 | Casey et al. | 357/80 |
| 4,280,132 | 7/1981 | Hayakawa et al. | 357/80 |
| 4,843,036 | 6/1989 | Schmidt et al. | 437/224 |
| 5,001,542 | 3/1991 | Tsukagoshi et al. | 357/80 |
| 5,107,325 | 4/1992 | Nakayoshi | 361/402 |

Primary Examiner—Andrew J. James
Assistant Examiner—Carl Whitehead, Jr.
Attorney, Agent, or Firm—Dale W. Dorinski

[57] ABSTRACT

A semiconductor device assembly comprises a semiconductor device (10) attached to a substrate (20). The substrate has a metallization pattern (22) on the surface and a polymeric film (24) covering most of the surface and the metallization pattern. A window-frame shaped opening (26) is created in the film, exposing portions of the substrate surface. The semiconductor device is attached to the substrate in such a manner that it lies in the interior perimeter (28) of the window-frame shaped opening in the film. An adhesive material (18) is applied to fill the space between the semiconductor device and the substrate. The window frame opening in the polymeric film serves to confine the adhesive to the area in the opening and underneath the device and prevents unwanted spread of the underfill material by forming an ideal fillet geometry. In another embodiment of the invention, the semiconductor device is in a package and the package is attached directly to the substrate.

27 Claims, 3 Drawing Sheets

SEMICONDUCTOR DEVICE WITH CONTROLLED SPREAD POLYMERIC UNDERFILL

TECHNICAL FIELD

This invention relates generally to semiconductor devices and more particularly to surface mounted semiconductor devices in packages.

BACKGROUND

Leadless chip carriers provide a high number of input and output connections between a chip and a corresponding substrate in a relatively small package. Leadless chip carriers generally consist of a package containing a sheet of ceramic, such as alumina, which forms a chip carrier or base onto which the chip is mounted. The chip carrier is then surface mounted, usually onto a larger printed circuit board (PCB) or other substrate, simply by placing the carrier on the PCB contact pads which mirror those of the chip carrier. An electrical and mechanical connection is then made by soldering the chip carrier to the larger substrate by reflow soldering. This solder connection is typically made using solder paste or bumping the bottom of the chip carrier with solder balls. Electrical connection paths within the leadless chip carrier allow the pads of the chip to be brought to external contact pads on the chip carrier.

The area required for attaching the chip to the substrate or printed circuit board may be reduced by eliminating the chip carrier package or the chip carrier itself, and simply mounting the chip or integrated circuit directly on the substrate. In this process, known as flip-chip technology, a bumped integrated circuit (IC) carries the pad arrangement on a major top surface which is turned upside down (flipped), allowing direct coupling between the pads of the IC and matching contacts on the main circuit board or chip carrier. This direct connection is facilitated by depositing solder or gold bumps on the IC input/output pads or terminals. The flipped bumped IC is otherwise referred to as a flip-chip. The flip-chip is then aligned to the pads on the major substrate and all connections are made simultaneously by reflowing the solder or gold bumps.

In order to protect the solder joint or gold bump interconnection between the flip-chip and the substrate from fatiguing during thermal cycling, and to environmentally protect the chip, a dielectric material is applied between the flip-chip and the substrate. The dielectric material is typically an epoxy resin with a coefficient of thermal expansion similar to that of the solder, to improve thermal fatigue life. The epoxy resin is typically applied around the perimeter of the flip-chip or by underfilling the chip from the back side of the substrate. During this process, excess epoxy can easily flow beyond the perimeter of the flip-chip or chip carrier onto unwanted areas of the substrate, causing numerous problems and stress variations on the system. Attempts have been made to regulate the unwanted flow of epoxy resin by stringently controlling the quantity of epoxy resin dispensed and also the process variables. Many modifications of epoxy resins have been made to customize the viscosity of the resin to the required application, with limited success.

Clearly, an improved method of applying underfill to chip carriers or flip-chips is needed which provides a simple and cost-effective solution to the problem of epoxy bleedout.

SUMMARY OF THE INVENTION

Briefly, according to the invention, there is provided a semiconductor device assembly comprising a semiconductor device attached directly to a substrate. The substrate has a metallization pattern on the surface and a polymeric film covering most of the substrate and the metallization pattern. A window-frame shaped opening is created in the film, exposing portions of the substrate surface. The semiconductor device is attached to the substrate in such a manner that it lies within the perimeter of the window-frame shaped opening in the film. An adhesive material is applied to fill the space between the semiconductor device and the substrate. The window frame opening in the polymeric film confines the adhesive to the area within the opening and underneath the device.

In still another embodiment of the invention, the semiconductor device is in a package and the package is attached directly to the substrate.

DETAILED DESCRIPTION OF THE PREFERRED EMBODIMENT

Figure 1:
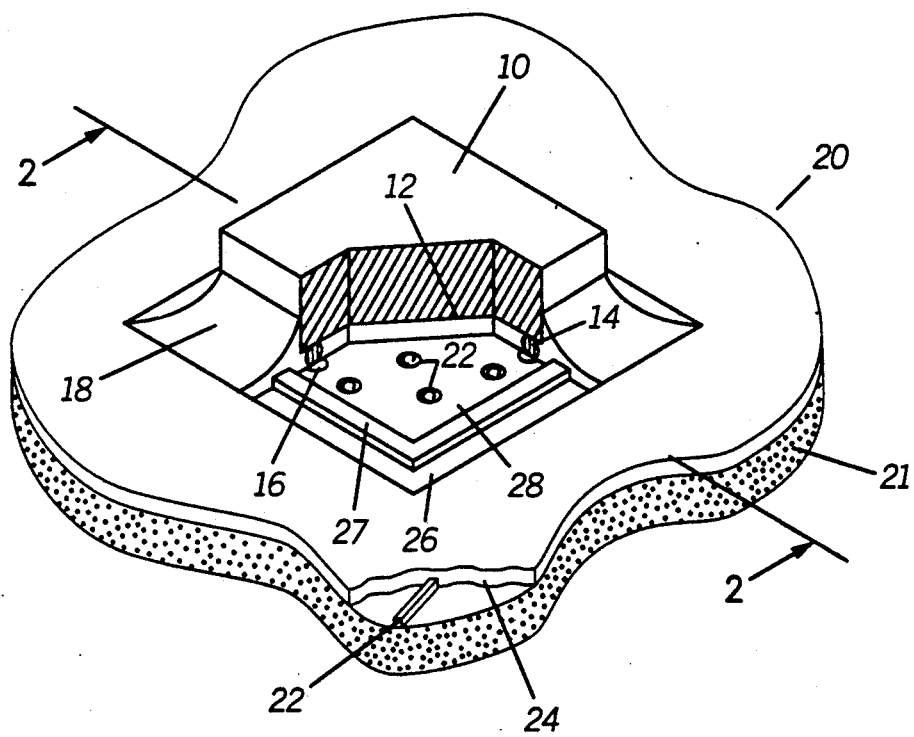
FIG. 1 is a isometric cut-away view of a flip-chip attached to a substrate in accordance with the invention.

Referring to FIG. 1, an isometric view of a flip-chip mounted to a substrate, an integrated circuit or semiconductor device 10 has a major or active surface 12 comprising integrated circuitry and an arrangement of pads. The pads have bumps or hemispherical protrusions 14. In the preferred embodiment of the invention, the bumps 14 comprise solder bumps which are grown on the flip-chip or integrated circuit utilizing well-known masking and plating techniques or sputtering, ball bumping, etc.

A substrate or chip carrier 20 comprises a dielectric insulating material 21 having a metallization pattern 22 on a first major surface. A polymeric film or solder mask 24 is applied over the conductive pattern 22 and the surface of the dielectric material 21. The polymeric film is typically a solder mask commonly used in the industry to cover printed circuit boards and ceramic substrates. Materials such as epoxies, acrylics, urethanes and mixtures thereof are typically used and the solder mask is typically applied by screen printing or photoimaging using dry film or liquid materials. The selection, use, and application of solder masks to printed circuit boards is well known in the industry. A window frame shaped opening 26 is formed in the solder mask 24. The opening 26 extends completely through the entire thickness of the solder mask so as to expose the bare substrate 20. The opening is preferably 5–20 mils wide and may be between 5 and 100 mils wide. The window frame opening 26 is also configured to assume a shape approximating the shape of the flip-chip 10, that is, a rectangular chip will have a rectangular shaped window frame opening, a square chip will have a square opening, and so forth. The size of the opening is adjusted so as to be slightly larger than the perimeter of the flip-chip. For example, the interior edge of the opening should be between 15 and 50 mils beyond the perimeter or edge of the flip-chip or die. As shown in FIG. 1, the window frame opening surrounds the flip-chip, forming a trench or moat around the entire perimeter of the flip-chip. A second portion of solder mask 27 forms the interior part of the window frame opening and is concentric with the window frame opening. Contained within the boundaries of the second portion of solder mask 27 is another opening 28 which exposes the surface of the printed circuit board 20 and also any conductive patterns 22 contained within or on the printed circuit board.

As electrical assembly is produced by placing and securing the flip-chip 10 on the top surface of the substrate or chip carrier 20. The flip-chip is placed in the opening 28 of the solder mask and the flip-chip bumps 14 are aligned with the conductive contact pads 16 on the substrate surface. The flip-chip 10 is electrically connected to the substrate 20 by reflowing the bumps 14 so as to form an electrical and metallurgical connection between the IC and the substrate. The bumps may alternatively be formed on the substrate prior to attachment of the chip, i.e., either surface may bear solder. After the reflowing operation is complete, a space or void is left between the major surface of the flip-chip 10 and the first surface of the substrate 20. The size of the void is controlled by the height of the reflowed solder bumps 14 and thickness of metal layer 22.

An underfill material 18 is typically applied to fill the void or space between the flip-chip and the substrate. The purpose of the underfill material is to environmentally seal the active surface of the flip-chip and also the electrical interconnection 14. The underfill material 18 also serves to provide an additional mechanical bond between the flip-chip and the substrate and prevents excessive stress on the small electrical interconnects between the chip and the substitute. The underfill material is typically an epoxy resin that may be loaded with inert fillers, and the viscosity of the epoxy is adjusted so as to provide the proper flow characteristics. Those skilled in the art will understand the need to have an appropriately controlled viscosity in order to ensure complete filling of the void. The epoxy underfill is typically accomplished by applying the epoxy around the perimeter of the flip-chip and allowing it to flow underneath the chip or by backfilling the space between the chip and the substrate through a hole in the substrate that lies underneath the chip. If the backfilling method is employed, the hole is typically situated near the center of the flip-chip so that the epoxy spread is uniform. In order to confine and control the spread of excess underfill material and form an ideal fillet, the trench or window frame opening 26 is utilized in the solder mask of the substrate 20.

Figure 2:
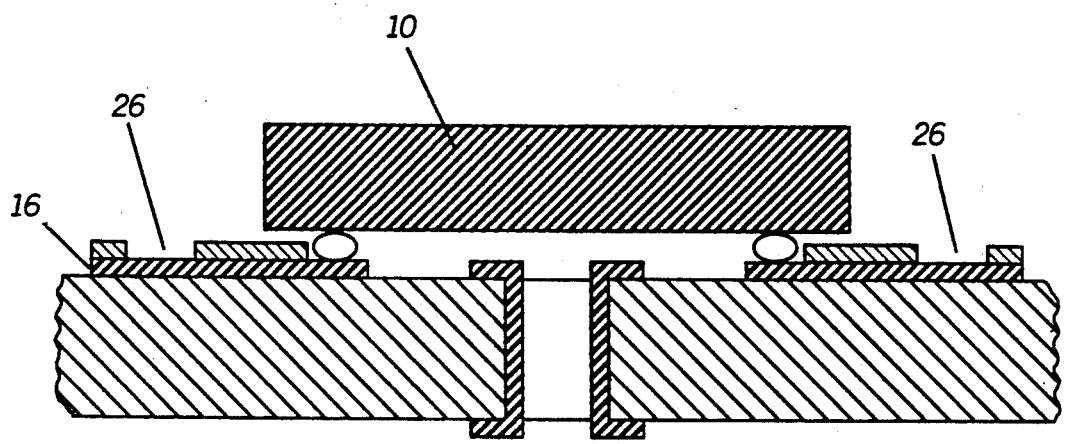
FIG. 2 is a cross section through plane 2—2 of FIG. 1 of a die soldered to a substrate in accordance with the present invention.
Figure 3:
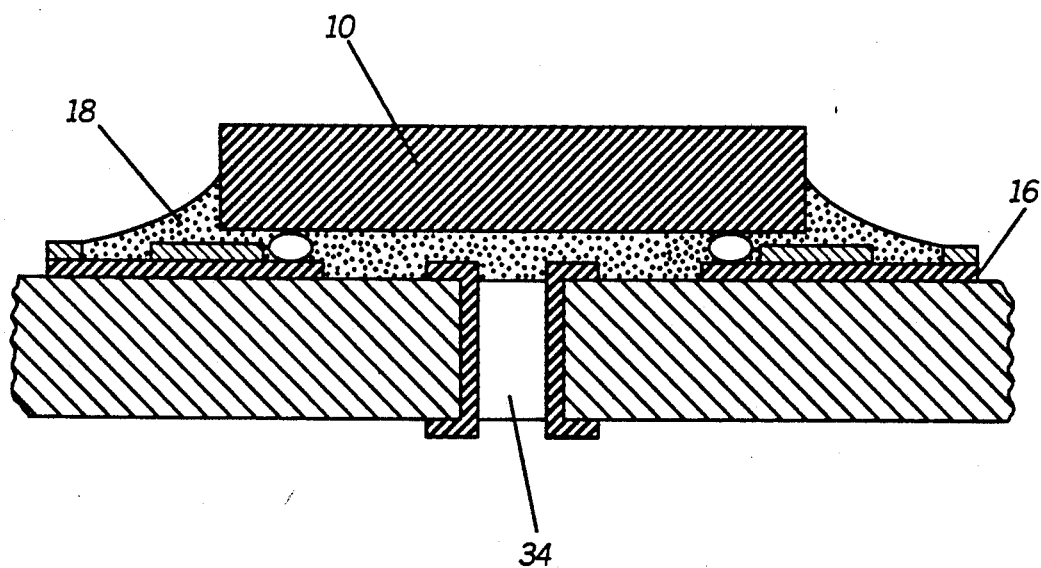
FIG. 3 is a cross-sectional view of FIG. 1 through plane 2—2 after application of underfill material.

Referring now to FIG. 2, a cross section through plane 2—2 of FIG. 1, the window frame opening or trench 26 may be clearly seen to lay slightly beyond the perimeter of the flip-chip. FIG. 2 is a cross-sectional view prior to application of the underfill material. As the underfill material is added, in this case by means of a hole 34 through the substrate (see FIG. 3), the underfill material 18 coats the surfaces of the die and substrate and spreads out onto the substrate. The trench or window frame opening 26 prevents the spread of underfill material beyond the edges of the trench by means of surface tension. Once reaching the trench or opening, movement of the epoxy underfill is impeded beyond the edge due to its surface tension, similar to the phenomenon of water in a glass. By controlling the depth and width of the opening 26, the underfill material 18 may be easily controlled and a wider range of viscosities may be utilized. The use of the opening 26 around the die also allows a wider process variation in the amount of underfill material used for each application. By utilizing the trench or opening 26, the amount of underfill material does not have to be as tightly controlled compared to conventional application methods and the time required for dispensing the underfill is typically reduced. Depending upon the amount of material dispensed and the dimensions of the opening 26, the material may just reach the interior edge of the opening, it may partially fill the opening, or it may totally fill the opening and reach the exterior perimeter of the opening. After application of the underfill material, the material 18 is then cured either by heat, ultraviolet light, radiation, or other means in order to form a solid mass.

Figure 4:
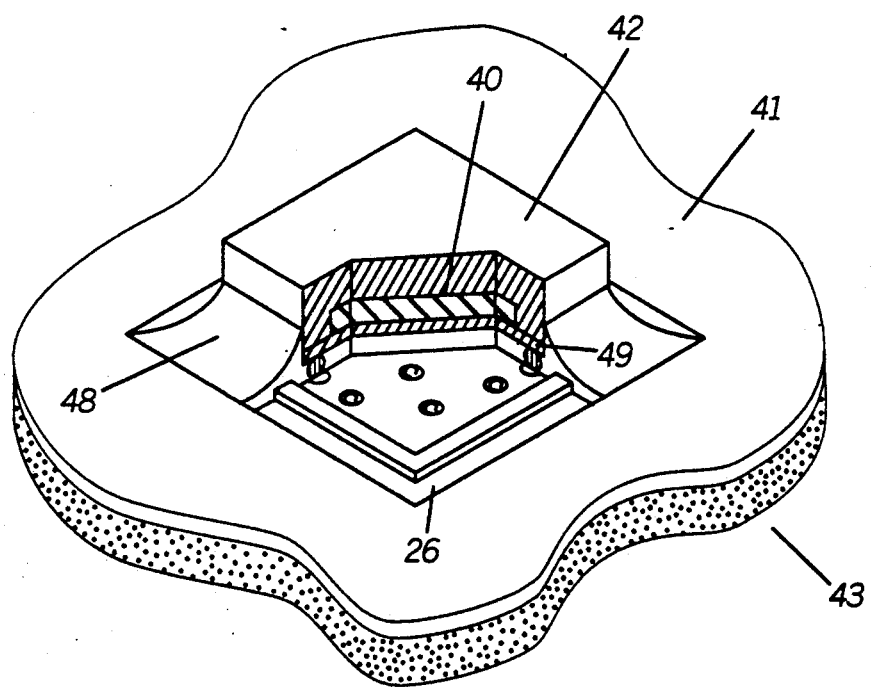
FIG. 4 is an isometric view of an alternate embodiment of the invention.

In an alternate embodiment of the invention, the integrated circuit 40 is enclosed in a package such as a chip carrier or an overmolded chip carrier 41 (FIG. 4). The chip carrier package consists of a circuit carrying substrate 49 having metallization and a semiconductor device placed on the circuit carrying substrate. The semiconductor package has a body 42 which consists of the cover or transfer molded material over the device and may be placed onto the PCB 43 in a similar manner as explained above. The substrate 43 also has a window frame shaped opening 46 that approximates the size of the semiconductor package 41 body and serves to confine the underfill material 48 within the opening. As seen in FIG. 4, fillets of underfill material 48 flow out beyond the perimeter of the package body, and are halted or confined by the window frame opening 46.

One skilled in the art can readily see that the concept of this invention may be equally applied to the application of flip-chips, chip carrier packages, other semiconductor packages, leaded and leadless devices, and so on, and may be utilized in a wide range of electronic applications. Therefore, the above examples have been presented by way of illustration and not by way of limitation and serve only to explain the invention and not to limit the scope of the invention.

What is claimed is:

1. A semiconductor device assembly, comprising:
    a semiconductor device having a perimeter and an active surface;
    a substrate having a metallization pattern;
    a polymeric film substantially covering the first surface and the metallization pattern, said polymeric film having a semiconductor device mounting area, comprising:
        a first opening exposing a portion of the substrate, substantially the same shape as the semiconductor device and larger than the device perimeter; and
        a portion of the polymeric film situated within and concentric to the first opening, said portion substantially the same shape and smaller than the first opening, creating a window frame opening in the mounting area;
    the semiconductor device being electrically attached to the metallization pattern with the active surface facing the substrate; and an adhesive material situated between the device and the substrate, said adhesive material substantially filling a void between the device active surface and the substrate and extending laterally to the window frame opening.

2. The assembly of claim 1, wherein the window frame opening is between about 5 mils and about 20 mils wide.

3. The assembly of claim 1, wherein the window frame opening is between about 15 mils and about 100 mils distant from the semiconductor device.

4. The assembly of claim 1, wherein the polymeric film is between about 0.5 mils and about 10 mils thick.

5. The assembly of claim 1, wherein the semiconductor device is attached to the substrate by means of solder spheres.

6. The assembly of claim 1, wherein the adhesive material extends into the window frame opening, and substantially fills the window frame opening.

7. The assembly of claim 1, wherein the adhesive material extends slightly beyond the window frame opening.

8. The assembly of claim 1, wherein the adhesive material does not fill the window frame opening.

9. A semiconductor device assembly, comprising:
a substrate having a flip chip attached by means of a plurality of metal bumps, said substrate having a solder mask substantially covering the substrate surface, said solder mask having a flip chip mounting area, comprising:
  a first opening exposing a portion of the substrate, substantially the same shape as the flip chip and larger than the flip chip; and
  a portion of the solder mask situated within and concentric to the first opening, the portion substantially the same shape and smaller than the first opening, creating a window frame opening in the mounting area; and
  an adhesive underfill material applied between the flip chip and the substrate, the underfill material extending beyond the flip chip perimeter to the window frame opening, and not beyond the opening.

10. The assembly of claim 9, wherein the window frame opening is between about 5 mils and about 20 mils wide.

11. The assembly of claim 9, wherein the window frame opening is between about 15 mils and about 100 mils distant from the flip chip.

12. The assembly of claim 9, wherein the solder mask is between about 0.5 mils and about 10 mils thick.

13. The assembly of claim 9, wherein the underfill material is an epoxy.

14. The assembly of claim 9, wherein the flip chip is attached to the substrate by means of solder.

15. The assembly of claim 9, wherein the underfill material extends into the window frame opening, and substantially fills the window frame opening.

16. The assembly of claim 9, wherein the underfill material extends slightly beyond the window frame opening.

17. The assembly of claim 9, wherein the underfill material does not fill the window frame opening.

18. An electronic assembly, comprising:
a semiconductor device package having a body;
a circuit carrying substrate having a first surface and a metallization pattern on said first surface;
a polymeric film substantially covering said first surface and said metallization pattern;
a window-frame opening defined in said polymeric film, said opening being substantially the same shape as said package body and larger than said device package, and extending through said film so as to expose said first surface, and;
said semiconductor device package electrically attached to said metallization pattern and situated within said window-frame opening so as to provide a space between said package and said substrate;
an underfill material situated between said package body and said circuit carrying substrate, said underfill material substantially filling said space and restricted within the limits of said window-frame opening.

19. The assembly of claim 18, wherein the window-frame opening between about 5 mils and about 20 mils wide.

20. The assembly of claim 18, wherein the window-frame opening has an interior perimeter and an exterior perimeter, said interior perimeter being between about 15 mils and about 100 mils larger than perimeter of said package.

21. The assembly of claim 18, wherein the polymeric film is between about 0.5 mils and about 10 mils thick.

22. The assembly of claim 18, wherein the underfill material is an epoxy.

23. The assembly of claim 18, wherein the package is attached to the substrate by means of solder.

24. The assembly of claim 18, wherein the underfill material extends into the window-frame opening, and substantially fills the window-frame opening.

25. The assembly of claim 18, wherein the underfill material extends slightly beyond the window-frame opening.

26. The assembly of claim 18, wherein the underfill material does not fill the window-frame opening.

27. The assembly of claim 1, further comprising a second opening situated within and concentric to the portion of the polymeric film, said second opening substantially the same shape and smaller than said portion of the polymeric film.

* * * * *